United States Patent
Dai et al.

(10) Patent No.: US 7,597,971 B2
(45) Date of Patent: Oct. 6, 2009

(54) THERMAL BARRIER COATING MATERIAL

(75) Inventors: Hui Dai, Changchun (CN); Jiayan Li, Changchun (CN); Xueqiang Cao, Changchun (CN); Jian Meng, Changchun (CN)

(73) Assignee: Changchun Institute of Applied Chemistry Chinese Academy of Science, Changchun, Jilin Province (CN)

( * ) Notice: Subject to any disclaimer, the term of this patent is extended or adjusted under 35 U.S.C. 154(b) by 685 days.

(21) Appl. No.: 11/218,892

(22) Filed: Sep. 2, 2005

(65) Prior Publication Data

US 2006/0246226 A1  Nov. 2, 2006

(30) Foreign Application Priority Data

Sep. 10, 2004 (CN) .................. 2004 1 0110900

(51) Int. Cl.
*B32B 9/00* (2006.01)
(52) U.S. Cl. .................. 428/701; 428/702; 428/469; 428/472; 416/241 B
(58) Field of Classification Search .................. None
See application file for complete search history.

(56) References Cited

U.S. PATENT DOCUMENTS 4,839,146 A * 6/1989 Cho et al. ................ 423/213.5
5,789,330 A    8/1998 Kondo et al.
6,231,991 B1   5/2001 Maloney

* cited by examiner

*Primary Examiner*—Timothy M Speer
(74) *Attorney, Agent, or Firm*—Knobbe Martens Olson & Bear LLP

(57) ABSTRACT

The present invention relates to a thermal barrier coating material having the chemical composition of $(1-n)CeO_2$-$nZrO_2$-$0.5R_2O_3$, where n is in the range of $0.9 \geq n \geq 0$ and R is selected from a group consisting of Nd, Sm, Eu, Gd, Tb and combinations of at least two among them. It possesses a thermal expansion coefficient higher than $12 \times 10^{-6} K^{-1}$ from ambient temperature up to 1200° C. and superior to those of the presently widely-used thermal barrier coating materials. Even if it is subjected to long time calcinations at 1400° C. or is quenched to room temperature, it can still maintain the stable crystal structure. In addition, its thermal expansion trend matches quite well with that of the bond coating alloy. This is beneficial to the elimination of thermal stress generated between the substrate and the ceramic top coating during the thermal cycle and can significantly improve the thermal shock resistance of the coating. The present invention further relates to a method for producing a thermal barrier coating material and a method for preparing a thermal barrier coating.

8 Claims, 2 Drawing Sheets

ABSTRACT# THERMAL BARRIER COATING MATERIAL

CROSS-REFERENCE TO RELATED APPLICATIONS

This application claims the benefit of Chinese Patent Application No.: 200410011090.0, filed Sep. 10, 2004.

FIELD OF THE INVENTION

The present invention relates to a high temperature thermal barrier coating material and a thermal barrier coating produced thereby.

BACKGROUND OF THE INVENTION

Along with the developments of civilian technologies of aviation, spaceflight, thermal power and etc, the demand on higher service temperature of the hot end parts of gas turbine engine is increasing. The superalloys and their single crystals are currently used at service temperatures approaching their upper limits of thermal stability. Under such a condition, from the viewpoint of improving material, the thermal barrier coating technique has been widely used as another feasible technique of reducing the surface working temperature of the vanes of the turbine engine.

The comparison research of National Aeronautics and Space Administration of USA indicated that the comprehensive properties of $ZrO_2$ are relatively superior. ZrO2 has a thermal expansion coefficient of $11 \times 10^{-6}$ $K^{-1}$ nearest to that of the substrate alloy, while its thermal conductivity coefficient is only 2.1-2.2 $Wm^{-1}$ $K^{-1}$. Pure $ZrO_2$, however, will undergo a martensitic transformation from tetragonal phase (t) to monoclinic phase (m) at normal service temperature. In order to make the coating acclimated to the high temperature thermal cycling working environment and to prolong the lifetime of the coating, small amount of stabilizer is generally added to $ZrO_2$ to control and reduce the occurrence of such kind of transformation.

U.S. Pat. No. 5,789,330 (Kondo, et al.) disclosed a thermal barrier coating material obtained by doping $ZrO_2$ with 0.1 wt %~40 wt % of various phase stabilizers such as Y2O3, CaO, MgO, $Sc_2O_3$, rare earth oxides and the like. After being sintered, the amount of the monoclinic phase is 25~75% of the system. The long-term maximum service temperature of the coating material was lower than 1200° C.

U.S. Pat. No. 6,231,991 disclosed that a material with pyrochlore structure, especially $La_2Zr_2O_7$, could be used as a thermal barrier coating material. $La_2Zr_2O_7$ has unique properties such as relatively low thermal conductivity and no phase transformation before melting. But the thermal expanse coefficient of $La_2Zr_2O_7$ is lower than that of YSZ. The difference between the thermal expanse coefficient of $La_2Zr_2O_7$ and that of substrate alloy is bigger. The occurrence of internal stress in the coating due to mismatch of thermal expansion at high temperature will be more serious. As a result, cycling life of the coated layer is short.

SUMMARY OF THE INVENTION

The objective of the present invention is to provide a thermal barrier coating material.

Another objective of the present invention is to provide a method of preparation for thermal barrier coating material.

The third objective of the present invention is to provide an application of the thermal barrier coating material.

According to one aspect of the invention, the invention provides a thermal barrier coating material having a fluorite structure and the chemical composition of $(1-n)CeO_2$-$nZrO_2$-$0.5R_2O_3$, where n is in the range of $0.9 \geq n \geq 0$ and R is selected from a group consisting of Nd, Sm, Eu, Gd, Tb and combinations of at least two among them.

According to another aspect, the invention provides a method for producing a thermal barrier coating material, comprising steps of:

a) mixing powders of $CeO_2$, $ZrO_2$ and $R_2O_3$ in a mole ratio of (1−n):n:0.5, where n is in the range of $0.9 \geq n \geq 0$ and R is selected from a group consisting of Nd, Sm, Eu, Gd, Tb and combinations of at least two among them; and b) grinding the resulting mixture obtained in step a) in a ball mill and heating the grinded product at 1200° C.~1600° C.

According to a further aspect, the invention provides a process for preparing a thermal barrier coating suitable to be used at a temperature higher than 1150° C., comprising a step of depositing a thermal barrier coating material having a fluorite structure and the chemical composition of $(1-n)CeO_2$-$nZrO_2$-$0.5R_2O_3$, where n is in the range of $0.9 \geq n \geq 0$ and R is selected from a group consisting of Nd, Sm, Eu, Gd, Tb and combinations of at least two among them, on the surface of a metal substrate by means of a plasma spraying and/or an electron beam physical vapor deposition to form a coating.

DETAILED DESCRIPTION OF THE PREFERRED EMBODIMENT

Figure 1:
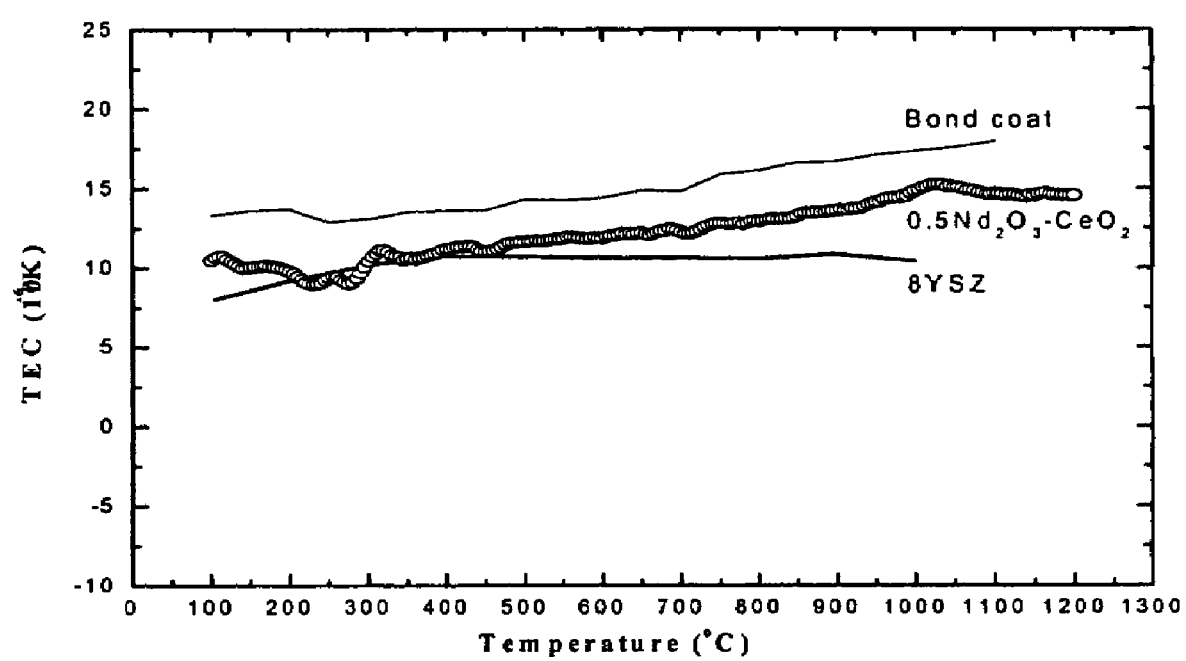
FIG. 1 shows a graph of the thermal expansion coefficient of the thermal barrier coating material of $CeO_2$-$0.5Nd_2O_3$, the NiCrAlY bond coating material and standard 8YSZ from room temperature to 1250° C.

In the present invention, properties of high thermal stability, high corrosion resistance and low thermal conductivity are utilized to realize the protection of superalloy substrate. Therefore the choice of material for thermal barrier ceramic top coating should obey some definite principles: high melting point, no phase transition from ambient temperature to service temperature, low thermal conductivity coefficient, chemical inert, relatively higher thermal expansion coefficient, good thermal shock resistance and lower sintering ability.

$CeO_2$ is an oxide having fluorite structure. Its thermal conductivity is smaller than that of 8YSZ and decreases exponentially with the increase of temperature while its thermal expansion coefficient is larger than that of 8YSZ and approaches that of nickel based superalloy. $CeO_2$ as a thermal barrier coating material can raise thermal shock resistance due to the following reasons: 1) there is no transformation from tetragonal phase to monoclinic phase in the coating; 2) the coating possesses good thermal barrier property and can lower the metal substrate temperature and thus can lower the degree of oxidation of the metal substrate; and 3) the coating has higher thermal expansion coefficient. However, pure $CeO_2$ is not suitable to be used alone due to its high oxygen diffusion rate and quick sintering ability at high temperature. In the present invention, one high temperature thermal barrier coating material with high thermal expansion coefficient, low thermal conductivity and low sintering ability is obtained by doping the $CeO_2$ system with rare earth zirconate $0.5R_2O_3$-$nZrO_2$, where $0.9 \geq n \geq 0$, R is selected from one group consisting of Nd, Sm, Eu, Gd, Tb and combinations of at least two among them.

The ceramic material of the present invention has the following chemical composition of $(1-n)CeO_2$-$nZrO_2$-$0.5R_2O_3$, where $0.9 \geq n \geq 0$ and R is selected from a group consisting of Nd, Sm, Eu, Gd, Tb and combinations of at least two among them.

Preferably, the method for preparing the ceramic thermal barrier material can be described as follows: Powders of $CeO_2$, $ZrO_2$ and $R_2O_3$ are mixed in the mole ratio of $(1-n)$:$n$:$0.5$, where n is in the range of $0.9 \geq n \geq 0$ and R is selected from a group consisting of Nd, Sm, Eu, Gd, Tb and combinations of at least two among them. Preferably, the mixture is grinded in a ball mill for 1-72 hrs and heated at 1200° C.~1600° C. for 2~24 hr. Under the same conditions, the ball milling and heating are optionally repeated 1~3 times.

According to one preferred embodiment of the present invention, the thermal barrier coating can be prepared by a method comprising steps of: a) providing a part made of nickel based or cobalt based superalloy as metal substrate; b) depositing one layer of MCrAlY alloy of thickness in the range of 100 μm to 200 μm as bond coating on the surface or certain location of the metal substrate, where M is selected from one group consisting of Ni, Co, Fe or combinations thereof and Y is selected from one group consisting of Y, La, Hf and combinations thereof; and c) depositing one layer of $(1-n)CeO_2$-$nZrO_2$-$0.5R_2O_3$ of thickness in the range of 200 μm to 600 μm as top coating on the surface of the metal bond coating, where n is in the range of $0.9 \geq n \geq 0$ and R is selected from one group consisting of Nd, Sm, Eu, Gd, Tb and combination of at least two among them.

The thermal barrier coating material of the present invention possesses high thermal expansion coefficient higher than $12 \times 10^{-6} K^{-1}$ from ambient temperature up to 1200° C. which is superior to those of the presently widely-used thermal barrier coating materials. Even if the coating material is subjected to long time calcinations at 1400° C. or quenched to room temperature, it can still maintain the stable crystal structure. As a thermal barrier coating material, it can be used at a temperature higher than 1150° C. The present thermal barrier coating material can be deposited on the surface of the metal substrate by various conventional methods, for example, the plasma spraying or the electron beam physical vapor deposition.

FIG. 1 indicates that the present ceramic material possesses a high thermal expansion coefficient. For example, its thermal expansion coefficient is $12.8 \times 10^{-6} K^{-1}$ from ambient temperature up to 1250° C., which is superior to those of the presently widely-used thermal barrier coating materials. In addition, its thermal expansion trend matches quite well with that of the bond coating alloy, which is beneficial to eliminate thermal stress generated between the metal and the ceramic coating during thermal cycling, improve the thermal shock resistance of the coating and prolong the service life of the coating.

Figure 2:
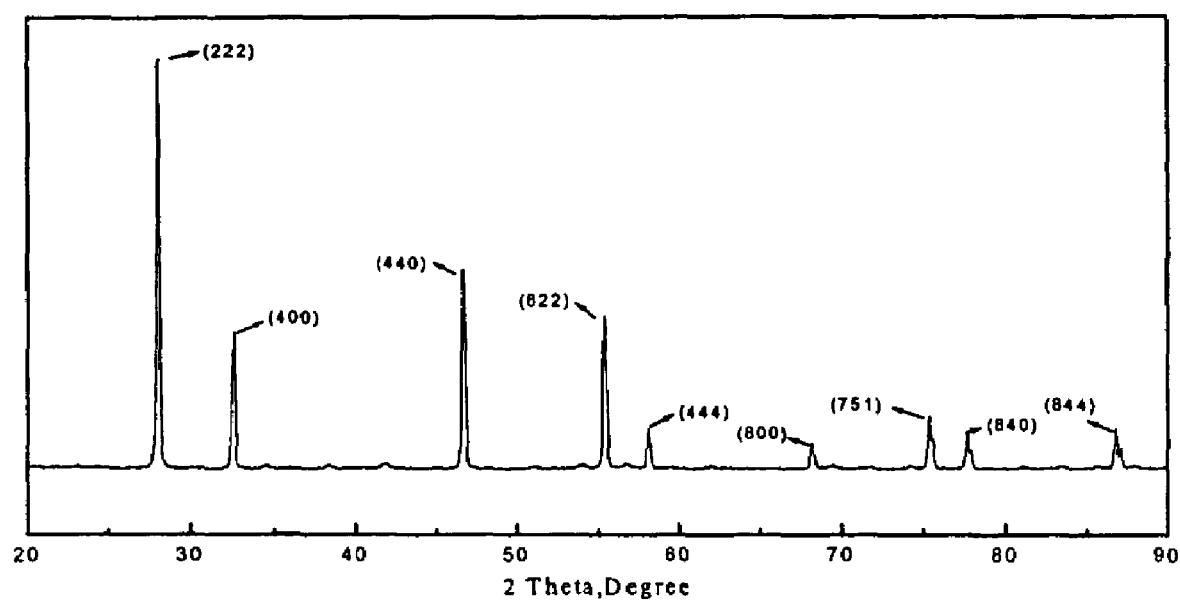
FIG. 2 shows a XRD spectrum of the thermal barrier coating material of $CeO_2$-$0.5Nd_2O_3$ prepared in Example 1, obtained by using a $CuK_\alpha$ radiation, a tube current of 20 mA and a tube voltage of 40 kV.

FIG. 2 indicates that powder sample $CeO_2$-$0.5Nd_2O_3$ obtained in Example 1 has a fluorite structure.

The thermal barrier coating material according to the present invention has larger thermal expansion coefficient proximate to that of the superalloy of the hot end part of the turbine engine. Therefore, the coating obtained by depositing the material has very low thermal stress and long service life in thermal cycle. In addition, The material has the advantages of the following: raw material and facility can be easily obtained in market, the method for preparing the coating is simple and so on.

BEST MODES FOR CARRYING OUT THE INVENTION

Example 1

$CeO_2$ powder and $Nd_2O_3$ powder were mixed in a molar ratio of 1:0.5. The mixture was ball milled for 1 hr and heated at 1600° C. for 2 hrs to give a powder sample of $CeO_2$-$0.5Nd_2O_3$. The powder sample was subjected to spray drying treatment to yield a highly flowable powder. A NiCrAlY metal bond coating of thickness of about 100 μm was first deposited on the surface of nickel based superalloy by means of electron beam physical vapor deposition and then a $CeO_2$-$0.5Nd_2O_3$ ceramic top coating of thickness of about 200 μm was deposited on the surface of the metal bond coating by means of the plasma spray.

Example 2

Powders of $CeO_2$, $ZrO_2$ and $Nd_2O_3$ were mixed in a molar ratio of 0.1:0.9:0.5. The mixture was ball milled for 24 hrs and heated at 1400° C. for 12 hrs. The ball milling and heating were repeated 2 times under the same conditions to give a powder sample of $0.1CeO_2$-$0.9ZrO_2$-$0.5Nd_2O_3$. The sample was subjected to spray drying treatment to yield a highly flowable powder. A Coral metal bond coating of thickness of about 150 μm was first deposited on the surface of nickel based superalloy by means of vacuum plasma spray coating and then on the surface of the metal bond coating a $0.1CeO_2$-$0.9ZrO_2$-$0.5Nd_2O_3$ ceramic top coating of thickness of about 300 μm was deposited by means of plasma spray.

Example 3

Powders of $CeO_2$, $ZrO_2$ and $Nd_2O_3$ were mixed in a molar ratio of 1:1:1. The mixture was ball milled for 72 hrs and heated at 1200° C. for 24 hrs. The ball milling and heating were repeated 3 times under the same conditions to give a powder sample of $CeO_2$—$ZrO_2$—$Nd_2O_3$. The sample was subjected to spray drying treatment to yield a highly flowable powder. On the surface of cobalt based superalloy a FeCrAlY metal bond coating of thickness of about 200 μm was first deposited by means of the vacuum plasma spray and then on the surface of the metal bond coating a $CeO_2$—$ZrO_2$—$Nd_2O_3$ ceramic top coating of thickness of about 600 μm was deposited by means of the electron beam physical vapor deposition.

Example 4

Powders of $CeO_2$ and $Sm_2O_3$ were mixed in a molar ratio of 1:0.5. The mixture was ball milled for 36 hrs and heated at 1400° C. for 2 hrs. The ball milling and heating were repeated 3 times under the same conditions to give a powder sample of $CeO_2$-$0.5Sm_2O_3$. The sample was subjected to spray drying treatment to yield a highly flowable powder. On the surface of nickel based superalloy a NiCrAlY metal bond coating of thickness of about 100 μm was first deposited by means of electron beam physical vapor deposition and then on the surface of bond coating a $CeO_2$-$0.5Sm_2O_3$ ceramic top coating of thickness of about 600 μm was deposited by means of plasma spray.

Example 5

Powders of $CeO_2$, $ZrO_2$ and $Sm_2O_3$ were mixed in a molar ratio of 0.1:0.9:0.5. The mixture was ball milled for 2 hrs and heated at 1600° C. for 12 hrs. The ball milling and heating were repeated 3 times under the same conditions to give a powder sample of $0.1CeO_2$-$0.9ZrO_2$-$0.5Sm_2O_3$. The sample was subjected to spray drying treatment to yield a highly flowable powder. On the surface of nickel based superalloy a CoCrAlY metal bond coating of thickness of about 150 μm was first deposited by means of vacuum plasma spray and then on the surface of the metal bond coating a $0.1CeO_2$-$0.9ZrO_2$-$0.5Sm_2O_3$ ceramic top coating of thickness of about 200 μm was deposited by means of the plasma spray.

Example 6

Powders of $CeO_2$, $ZrO_2$ and $Sm_2O_3$ were mixed in a molar ratio of 1:1:1. The mixture was ball milled for 36 hrs and heated at 1500° C. for 2 hrs. The ball milling and heating were repeated 3 times under the same conditions to give a powder sample of $CeO_2$—$ZrO_2$—$Sm_2O_3$. The sample was subjected to spray drying treatment to yield a highly flowable powder. On the surface of cobalt based superalloy a FeCrAlY metal bond coating of thickness of about 200 μm was first deposited by means of vacuum plasma spray and then on the surface of the metal bond coating a $CeO_2$—$ZrO_2$—$Sm_2O_3$ ceramic top coating of thickness of about 200 μm was deposited by means of electron beam physical gas phase deposition.

Example 7

Powders of $CeO_2$ and $Eu_2O_3$ were mixed in a molar ratio of 1:0.5. The mixture was ball milled for 2 hrs and heated at 1600° C. for 2 hrs. The ball milling and heating were repeated 2 times under the same conditions to give a powder sample of $CeO_2$-$0.5Eu_2O_3$. The sample was subjected to spray drying treatment to yield a highly flowable powder. On the surface of nickel based superalloy a NiCrAlY metal bond coating of thickness of about 100 μm was first deposited by means of electron beam physical vapor deposition and then on the surface of the metal bond coating a $CeO_2$-$0.5Eu_2O_3$ ceramic top coating of a thickness of about 400 μm was deposited by means of plasma spray.

Example 8

Powders of $CeO_2$, $ZrO_2$ and $Eu_2O_3$ were mixed in a molar ratio of 0.1:0.9:0.5. The mixture was ball milled for 24 hrs and heated at 1400° C. for 12 hrs. The ball milling and heating were repeated 3 times under the same conditions to give a powder sample of $0.1CeO_2$-$0.9ZrO_2$-$0.5Eu_2O_3$. The sample was subjected to spray drying treatment to yield a highly flowable powder. On the surface of nickel based superalloy a CoCrAlY metal bond coating of thickness of about 150 μm was first deposited by means of vacuum plasma spray and then on the surface of the metal bond coating a $0.1CeO_2$-$0.9ZrO_2$-$0.5Eu_2O_3$ ceramic top coating of thickness of about 400 μm was deposited by means of plasma spray.

Example 9

Powders of $CeO_2$, $ZrO_2$ and $Eu_2O_3$ were mixed in a molar ratio of 1:1:1. The mixture was ball milled for 72 hrs and heated at 1200° C. for 24 hrs. The ball milling and heating were repeated 2 times under the same conditions to give a powder sample of $CeO_2$—$ZrO_2$—$Eu_2O_3$. The sample was subjected to spray drying treatment to yield a highly flowable powder. On the surface of cobalt based superalloy a FeCrAlY metal bond coating of thickness of about 200 μm was first deposited by means of vacuum plasma spray and then on the surface of the metal bond coating a $CeO_2$—$ZrO_2$—$Eu_2O_3$ ceramic top coating of thickness of about 600 μm was deposited by means of electron beam physical vapor deposition.

Example 10

Powders of $CeO_2$ and $Gd_2O_3$ were mixed in a molar ratio of 1:0.5. The mixture was ball milled for 72 hrs and heated at 1600° C. for 24 hrs. The ball milling and heating were repeated 3 times under the same conditions to give a powder sample of $CeO_2$-$0.5Gd_2O_3$. The sample was subjected to spray drying treatment to yield a highly flowable powder. On the surface of nickel based superalloy a NiCrAlY metal bond coating of thickness of about 150 μm was first deposited by means of electron beam physical vapor deposition and then on the surface of bond coating a $CeO_2$-$0.5Gd_2O_3$ ceramic top coating of thickness of about 300 μm was deposited by means of plasma spray.

Example 11

Powders of $CeO_2$, $ZrO_2$ and $Gd_2O_3$ were mixed in a molar ratio of 0.1:0.9:0.5. The mixture was ball milled for 2 hrs and heated at 1200° C. for 2 hrs to give a powder sample of $0.1CeO_2$-$0.9ZrO_2$-$0.5Gd_2O_3$. The sample was subjected to spray drying treatment to yield a highly flowable powder. On the surface of nickel based superalloy a CoCrAlY metal bond coating of thickness of about 150 μm was first deposited by means of vacuum plasma spray and then on the surface of the metal bond coating a $0.1CeO_2$-$0.9ZrO_2$-$0.5Gd_2O_3$ ceramic top coating of thickness of about 250 μm was deposited by means of plasma spray.

Example 12

Powders of $CeO_2$, $ZrO_2$ and $Gd_2O_3$ were mixed in a molar ratio of 1:1:1. The mixture was ball milled for 36 hrs and heated at 1400° C. for 12 hrs. The ball milling and heating were repeated 2 times under the same conditions to give a powder sample of $CeO_2$—$ZrO_2$—$Gd_2O_3$. The sample was subjected to spray drying treatment to yield a highly flowable powder. On the surface of cobalt based superalloy a FeCrAlY metal bond coating of thickness of about 150 μm was first deposited by means of vacuum plasma spray and then on the surface of the metal bond coating a $CeO_2$—$ZrO_2$—$Gd_2O_3$ ceramic top coating of thickness of about 300 μm was deposited by means of electron beam physical vapor deposition.

Example 13

Powders of $CeO_2$ and $Tb_2O_3$ were mixed in a molar ratio of 1:0.5. The mixture was ball milled for 36 hrs and heated at 1600° C. for 12 hrs. The ball milling and heating were repeated 3 times under the same conditions to give a powder sample of $CeO_2$-$0.5Tb_2O_3$. The sample was subjected to spray drying treatment to yield a highly flowable powder. On the surface of nickel based superalloy a NiCrAlY metal bond coating of thickness of about 150 μm was first deposited by means of electron beam physical vapor deposition method and then on the surface of the metal bond coating a $CeO_2$-

$0.5Tb_2O_3$ ceramic top coating of thickness of about 300 μm was deposited by means of plasma spray.

Example 14

Powders of $CeO_2$, $ZrO_2$ and $Tb_2O_3$ were mixed in a molar ratio of 0.1:0.9:0.5. The mixture was ball milled for 1 hr and heated at 1400° C. for 24 hrs. The ball milling and heating were repeated 2 times under the same conditions to give a powder sample of $0.1CeO_2$-$0.9ZrO_2$-$0.5Tb_2O_3$. The sample was subjected to spray drying treatment to yield a highly flowable powder. On the surface of nickel based superalloy a CoCrAlY metal bond coating of thickness of about 150 μm was first deposited by means of vacuum plasma spray and then on the surface of the metal bond coating a $0.1CeO_2$-$0.9ZrO_2$-$0.5Tb_2O_3$ ceramic top coating of thickness of about 250 μm was deposited by means of plasma spray.

Example 15

Powders of $CeO_2$, $ZrO_2$ and $Tb_2O_3$ were mixed in a molar ratio of 1:1:1. The mixture was ball milled for 72 hrs and heated at 1200° C. for 2 hrs to give a powder sample of $CeO_2$—$ZrO_2$—$Tb_2O_3$. The sample was subjected to spray drying treatment to yield a highly flowable powder. On the surface of cobalt based superalloy a FeCrAlY metal bond coating of thickness of about 150 μm was first deposited by means of vacuum plasma spray and then on the surface of bond coating a $CeO_2$—$ZrO_2$—$Tb_2O_3$ ceramic top coating of thickness of about 300 μm was deposited by means of electron beam physical vapor deposition.

What is claimed is:

1. A thermal barrier coating material having the chemical composition of $(1-n)CeO_2$-$nZrO_2$-$0.5R_2O_3$, where n is in the range of $0.9 \geq n \geq 0$ and R is selected from the group consisting of Nd, Sm, Eu, Gd, Tb and combinations of at least two thereof.

2. A thermal barrier coating material produced by a method comprising steps of:
   a) mixing powders of $CeO_2$, $ZrO_2$ and $R_2O_3$ in molar ratio of $(1-n):n:0.5$, where n is in the range of $0.9 \geq n \geq 0$ and R is selected from one group consisting of Nd, Sm, Eu, Gd, Tb and combinations of at least two among them; and
   b) grinding the resulting mixture obtained in step a) in ball mill and heating the grinded product at about 1200° C. to about 1600° C.

3. The thermal barrier coating material according to claim 2, wherein the grinding step is carried out for 1 to about 72 hrs.

4. The thermal barrier coating material according to claim 2, wherein the heating step is carried out for 2 to about 24 hrs.

5. The thermal barrier coating material according to claim 2, wherein the step b) is repeated 1 to 3 times.

6. A thermal barrier coating suitable to be used at a temperature higher than 1150° C., produced by a process comprising a step of depositing a thermal barrier coating material having the chemical composition of $(1-n)CeO_2$-$nZrO_2$-$0.5R_2O_3$, where n is in the range of $0.9 \geq n \geq 0$ and R is selected from the group consisting of Nd, Sm, Eu, Gd, Tb and combinations of at least two thereof, on the surface of a metal substrate by means of plasma spray and/or electron beam physical vapor deposition to form a coating.

7. The thermal barrier coating according to claim 6, wherein the metal substrate is a part made of a nickel based or cobalt based high temperature superalloy as a metal substrate.

8. The thermal barrier coating according to claim 6, wherein, before the depositing step, further comprising a step of depositing a layer of MCrAlY alloy of thickness in the range of 100 μm to 200 μm as a metal bond coating on the surface or certain location of the metal substrate, where M is selected from the group consisting of Ni, Co, Fe and combinations thereof, and wherein Y is selected from the group consisting of Y, La, Hf and combinations thereof.

* * * * *